United States Patent [19]

Dubois et al.

[11] Patent Number: 4,579,752

[45] Date of Patent: Apr. 1, 1986

[54] ENHANCED CORROSION RESISTANCE OF METAL SURFACES

[75] Inventors: Lawrence H. Dubois; Ralph G. Nuzzo, both of Summit, N.J.

[73] Assignee: AT&T Bell Laboratories, Murray Hill, N.J.

[21] Appl. No.: 665,915

[22] Filed: Oct. 29, 1984

[51] Int. Cl.$^4$ .............................................. C23C 16/00
[52] U.S. Cl. .................................. 427/255; 148/6.3; 148/6.35; 148/6.31
[58] Field of Search .................. 148/6.3, 6.35, 6.31; 427/255.4, 255

[56] References Cited

U.S. PATENT DOCUMENTS 3,383,235 5/1985 Blackburn ..................... 427/255.4
4,507,401 3/1985 Dubois ............................ 502/242

FOREIGN PATENT DOCUMENTS 0006426 1/1980 Japan .............................. 148/6.3
1529441 10/1978 United Kingdom ............ 148/6.3

Primary Examiner—Sam Silverberg
Attorney, Agent, or Firm—Bruce S. Schneider

[57] ABSTRACT

Metal surfaces are protected from corrosion by reaction with a silane. In the case of a clean metal surface, reaction with the silane produces an intermetallic compound that is subsequently oxidized to yield a surface layer of, for example, silicon oxide. In the situation where the metal has an oxide coating, the silane reacts directly with this coating to produce the protective surface.

5 Claims, 1 Drawing Figure

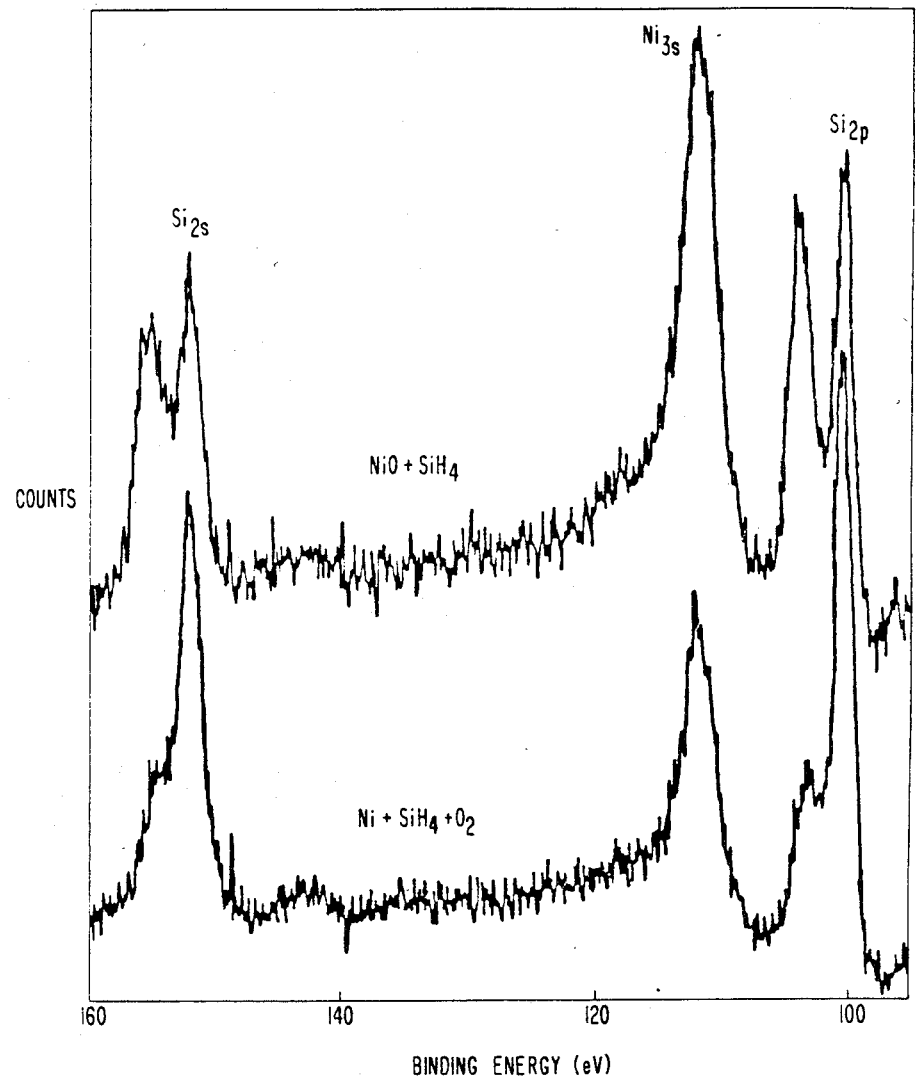

ENHANCED CORROSION RESISTANCE OF METAL SURFACES

BACKGROUND OF THE INVENTION

1. Field of the Invention

This invention relates to metal treatment and, in particular, to metal corrosion resistance.

2. Art Background

Metals such as copper, nickel, and silver are extremely important for their use in a vast number of applications. Not only are such metals used for their aesthetic appeal in ornamental objects but additionally, a wide base of industries, such as the electronics industry, heavily rely on these materials for their electrical and structural properties. Whether the metals are used for ornamental purposes, structural purposes, or for high technology products, corrosion, e.g., oxidation, of the metal surface seriously degrades its usefulness for many desired applications. A variety of specific treatments has been developed, each directed towards preventing chemical corrosion, e.g., oxidation, in a specific metal. Broad solutions to metal corrosion have not been forthcoming. It is always desirable, if possible to find a technique with broader applicability that provides enhanced corrosion resistance for metal surfaces.

SUMMARY OF THE INVENTION

Enhanced corrosion, e.g., oxidation, resistance, has been achieved for surfaces containing metals from Group IB, Group VB except vanadium, Group VIB, and Group VIII except iron, e.g., copper, nickel, rhodium, platinum, molybdenum, tantalum, tungsten, gold, and silver, by utilizing a process including the reaction of the metal surface with silanes. (Group designations are those from the Mendelyeevian Periodic Table.) In this process, either the elemental metal reacts to form an intermetallic compound which is subsequently oxidized and/or a surface oxide reacts directly to form a silicon-containing region such as a region including silicon oxide, e.g., $SiO_x$, where $0 < x \leq 2$ and/or a hydroxide of a silicon oxide. By using a suitable silane concentration, silicon-containing protective regions are formed having a mass thickness greater than 15 Angstroms. Excellent resistance to corrosion is provided by the outstanding stability and inertness of the surface region, e.g., silicon oxide region.

BRIEF DESCRIPTION OF THE DRAWING

The FIGURE is illustrative of the results obtainable with the invention.

DETAILED DESCRIPTION

A silicon-containing region, e.g., a silicon oxide region, is formed on the surface of metals through the interaction of the metal surface with silanes. For purposes of this invention, silanes include $SiH_4$, substituted silanes such as $CH_3SiH_3$, higher order silanes such as disilane, and substituted higher order silanes. However, the use of $SiH_4$ is preferred. Therefore, the disclosure for pedagogic purposes will center on the use of $SiH_4$. The use of the process with substitued silanes, higher order silanes, and/or substituted higher order silanes, is identical to that employing $SiH_4$, except sufficient reducing agent is introduced to produce an intermetallic or oxide phase with relatively low contamination, e.g., carbon. Generally, for substituted silanes, an excess of reducing agent, e.g., hydrogen, over that required for the stoichiometric reaction is advantageously employed. The use of materials such as substituted silanes, although effective in producing enhanced corrosion resistance, in some instances results in some contamination, either from the reducing agent or from byproducts from the reaction between the reducing agent and the substituted silane. This contamination is not desirable for the most demanding applications, e.g., applications such as solid-state electronics, but is not significant for applications such as ornamental objects.

It has been found that the interaction between the silane and the metal proceeds through two possible paths. If an appropriate elemental metal is present at the surface, an intermetallic silicon-containing composition, e.g., a copper silicide, platinum silicide, nickel silicide, tungsten silicide, rhodium silicide, molybdenum silicide, silver silicide, or tantalum silicide, is produced. This material then interacts with oxygen, for example, oxygen in the air, to produce a surface region of, for example, a silicon oxide. If a metal oxide is present at the surface, the metal oxide acts as an oxidizing agent and the silane reacts directly to produce a silicon oxide region. If both metal and metal oxide are present, then both pathways are followed. When oxidation results in the formation of a silicon oxide region, this region is depleted of the metal in the form of oxide, i.e., contains less than 10 mole percent of metal atoms in a non-zero oxidation state. Although the precise reason for this occurrence is not known, it is contemplated that migration of silicon atoms to the surface occurs during the interactions yielding the segregated silicon oxide portion.

The metal surface to be treated is subjected to the silane for a sufficient time to produce a silicon-containing region having a mass thickness of at least 15 Angstroms, preferably at least 20 Angstroms, most preferably at least 30 Angstroms. (The mass thickness of a silicon-containing region is defined as the thickness of an imaginary layer conforming to the original untreated surface having perfect thickness uniformity, having the same lateral boundaries, and having the same weight of silicon-containing material.) Regions of thickness less than 5 Angstroms are generally not desirable because the possibility of discontinuities becomes significant. (The invention is particularly advantageous for the treatment of bulk metal regions, i.e., regions having thicknesses greater than 10 $\mu$m and thus having structural integrity. However, non-bulk region treatment is not precluded.) To obtain, after oxidation, a substantially metal-free, silicon-containing surface region, sufficient interaction between the silane and the metal and/or the metal oxide is required. Typically, reactive contact between (1) the metal and/or the metal oxide and (2) the silane at a partial pressure above $10^{-6}$ Torr for time periods generally longer than 50 seconds at $10^{-6}$ Torr, and concomitantly shorter times for higher pressures yield average thicknesses greater than 15 Angstroms. The temperature also significantly affects the reaction rate. For example, silver reacts quickly at room temperature. In contrast, comparable growth rates for tungsten and tantalum occur at temperatures of approximately 450 degrees C. A control sample is easily utilized to determine a temperature that yields nominal reaction rates for a given metal. Additionally, for some metals, e.g., gold, a more coherent overlayer is formed by reaction between silane and the metal oxide, rather than the elemental metal. In such cases, the metal oxide is advantageously first extensively formed on the metal by a process such as plasma oxidation. (See J. J. Pireaux et al, *Surface Science*, 141, page 221 (1984), for a description of plasma oxidation of gold. Other metals are oxidized by the same procedure.)

The higher the silane partial pressure and the longer the contact, generally the thicker the surface region of the silicon oxide. However, the thickness of the silicon oxide region does not continue increasing indefinitely, and typically a limit of 50 Angstroms at room temperature is reached because of mass transport limitations. It is also generally desirable that excessive surface contamination such as carbon and sulfur contamination is not present during treatment of the metal-containing surface with silane. Such contamination inhibits the reaction between the metal and silane or between the metal oxide and silane. Thus, it is desirable to remove materials, such as carbon and sulfur-containing materials, typically found on metal surfaces by procedures such as etching, sputtering, or degreasing before interaction with silane.

Basically, all that is required for reaction is that the surface of the metal to be treated is contacted with a silane gas. Techniques suitable for contacting the metal with silane are the same as those described in copending, coassigned U.S. patent Application Ser. No. 481,160, filed Apr. 1, 1983 (L. H. Dubois-R. G. Nuzzo Case 1-2), which is hereby incorporated by reference.

In the case reaction of the silane with metal, as opposed to metal oxide, subsequent oxidation is required. This oxidation occurs rapidly upon exposure to oxidizing agents such as air to yield a suitable surface region. However, if it is desired to carefully control the oxide formation, it is possible to expose the intermetallic compound to oxidizing agents at reduced pressures.

The following examples are illustrative of the invention.

EXAMPLE 1

A nickel foil 0.25 mm in thickness, measuring 6 mm × 15 mm, was degreased by immersion in acetone. The foil was placed on the sample holder of an ESCA spectrometer. The chamber was evacuated to a pressure of approximately $10^{-10}$ Torr, and the exposed surface of the foil was cleaned by sputtering, utilizing argon ions accelerated through a potential of 2 kV. The sputtering was discontinued, and the sample was heated to approximately 320 degrees C., utilizing a resistive heating element. The chamber was filled to a pressure of $10^{-1}$ Torr with a 1 percent silane-in-argon mixture. The chamber was sealed, and the silane-in-argon mixture maintained for 500 seconds. The mixture was then evacuated, and the sample was removed from the chamber to expose the silane-treated surface to air. An ESCA spectrum taken of the oxidized surface showed only oxidized silicon and essentially no oxidized metal. As can be seen from the FIGURE, peaks corresponding to oxidized silicon are present, and only peaks corresponding to elemental nickel appear.

EXAMPLE 2

The procedure of Example 1 was followed for the metals listed in Table 1, except the temperatures were changed as indicated in this Table. A surface layer consisting essentially of silicon oxide was formed for nickel, rhodium, platinum, and gold. In the case of molybdenum, tantalum, tungsten, and copper, a quite limited formation of the metal oxide with the silicon oxide was observed by ESCA spectroscopy. This formation, however, was easily suppressed by increasing the gas exposure, e.g., gas pressure and/or exposure time.

TABLE 1

| Metal | Treatment Temperature (°C.) |
| --- | --- |
| Ni | 320 |
| Rh | 340 |
| Pt | 340 |
| Mo | 550 |
| Ta | 550 |
| W | 550 |
| Cu | 120 |
| Au | 120 |

EXAMPLE 3

The procedure of Example 2 was followed except a metal oxide region was formed on the metal before its exposure to silane. This procedure of pre-metal oxide formation was also performed for the metals in the Table. The oxide formation in each case was accomplished by exposure of the metal to 100 Torr of oxygen for 15 minutes. The pre-oxidation of copper was accomplished at 150 degrees C. Gold, silver, and platinum, however, could not be sufficiently thermally oxidized by this procedure and thus were not further treated. In each case, a silicon oxide overlayer, upon reaction with silane, was formed. In the case of silver and platinum, although only a small amount of metal oxide was initially formed, this small amount was in fact converted to silicon oxide upon interaction with silane.

EXAMPLE 4

A gold sample, as discussed in Example 1, was degreased in organic solvents. The sample was then placed on the sample holder of an r.f. plasma reactor. The chamber was evacuated and then filled to a pressure of approximately 2 Torr. The chamber was sealed. A plasma was struck using an r.f. power of 300 watts at a frequency of 13.54 MHz. The r.f. power was continued for a period of 30 minutes and then terminated. This treatment produced a gold oxide layer on the original gold foil. The sample was then quickly transferred to a second chamber and exposed to a 1 percent silane-in-argon mixture at a pressure of 400 Torr. The temperature was increased at a rate of 10 degrees C./minute from room temperature to 130 degrees C. The temperature was then maintained at 130 degrees C. for approximately 15 minutes. This treatment resulted in a surface layer consisting essentially only of silicon oxide.

EXAMPLE 5

The procedure of Example 4 was followed except a silver foil was employed, and an r.f. power of 2 watts was utilized to strike the plasma. Again, a surface region consisting essentially of silicon oxide was obtained.

EXAMPLE 6

The procedure of Example 5 was performed except an r.f. power of 2 watts was utilized for 30 minutes to strike a plasma in an oxygen environment of 0.2 Torr. Again, a surface layer consisting essentially of silicon oxide was produced.

EXAMPLE 7

The procedure of Example 5 was followed except instead of an oxygen plasma, a plasma was produced in 0.20 Torr of water utilizing a power of 1 watt in a treatment time of 30 seconds. The entire process resulted in a layer consisting essentially of silicon dioxide. However, this layer was somewhat thinner than the layer obtained in the previous Examples.

EXAMPLE 8

The procedure of Example 5 was followed except the pre-oxidation step was accomplished by quickly immersing the sample in 30 percent $H_2O_2$. The results were essentially identical to the previous Examples.

EXAMPLE 9

The procedure of Example 3 was followed on platinum except the pre-oxidation step was performed by anodization. This anodization was accomplished by immersing the platinum in a 0.1 molar sulfuric acid aqueous solution. The voltage between the cathode and the anode was maintained at 1.5 volts relative to SCE. Again, a silicon oxide surface region was formed.

EXAMPLE 10

To demonstrate the enhanced corrosion properties of the inventive procedure, a copper sample treated by the procedure described in Example 2 was immersed for several minutes in a 0.1 molar aqueous solution of sodium bisulfide. No discoloration of the sample was observed. In contrast, an untreated copper sample immersed for an identical time turned black due to the formation of thick layers of copper sulfide.

What is claimed is:

1. A process for treating surfaces comprising metal atoms chosen from the group consisting of Group IB, Group VB except vanadium, Group VIB, and Group VIII except iron, of the Mendelyeevian Periodic Table, said process comprising the steps of (1) treatment of said surface with a silane gas; and (2) ensuring the presence of an oxidizing agent wherein said treatment and said presence of an oxidizing agent are continued for a time sufficient to produce a region containing silicon and oxygen that is at least 15 Angstroms in thickness wherein said surfaces before said treatment include an oxidized region and wherein after said treatment, said region containing silicon and oxygen contains less than 10 mole percent of said metal atoms in a non-zero oxidation state.

2. The process of claim 1 wherein said oxidizing agent comprises air.

3. The process of claim 1 wherein said oxidizing agent is an oxide of said metal.

4. The process of claim 1 wherein said metal is a member chosen from the group consisting of copper, gold, nickel, silver, rhodium, platinum, molybdenum, tantalum, and tungsten.

5. The process of claim 1 wherein said silicon-containing region comprises a silicon oxide.

* * * * *